United States Patent [19]

Tokumaru et al.

[11] 4,064,526
[45] Dec. 20, 1977

[54] I.I.L. WITH GRADED BASE INVERSELY OPERATED TRANSISTOR

[75] Inventors: Yukuya Tokumaru; Masanori Nakai; Satoshi Shinozaki; Junichi Nakamura; Shintaro Ito; Yoshio Nishi, all of Yokohama, Japan

[73] Assignee: Tokyo Shibaura Electric Co., Ltd., Tokyo, Japan

[21] Appl. No.: 644,048

[22] Filed: Dec. 24, 1975

[30] Foreign Application Priority Data

Dec. 27, 1974 Japan ............................... 49-148567

[51] Int. Cl.² .................. H01L 27/04; H01L 29/72; H01L 29/36
[52] U.S. Cl. ............................................ 357/46; 357/35; 357/36; 357/44; 357/90
[58] Field of Search .................. 357/35, 36, 44, 46, 357/90

[56] References Cited

U.S. PATENT DOCUMENTS 3,823,353 7/1974 Berger et al. ......................... 357/44
3,922,565 11/1975 Berger et al. ......................... 357/44

FOREIGN PATENT DOCUMENTS 2,224,574 11/1972 Germany ............................. 357/44

OTHER PUBLICATIONS

Blatt et al., IEEE Int. Electron Devices Meeting, Technical Digest, pp. 511-514, (Dec. 1974).
Lin, Integrated Electronics, (Holden-Day, San Francisco, 1967), pp. 186-192.

Primary Examiner—William D. Larkins
Attorney, Agent, or Firm—Finnegan, Henderson, Farabow & Garrett

[57] ABSTRACT

An integrated injection logic semiconductor device comprises an N type semiconductor substrate, a P type semiconductor layer laminated on said semiconductor substrate, and N type first region formed in a manner penetrating through said P type semiconductor layer to reach said N type semiconductor substrate, a first P type region formed in said first N type region, a second N type region formed in said P type semiconductor layer, and a second P type region formed between said second N type region and said N type semiconductor substrate in a manner connected directly to said N type semiconductor substrate. An integrated injection logic circuit is comprised of a lateral NPN transistor whose emitter, base and collector are constituted by said first P type region, first N type region and P type semiconductor layer, respectively, and a vertical PNP transistor whose emitter, base and collector are constituted by said N type semiconductor substrate, P type semiconductor layer plus second P type region, and second N type region, respectively.

7 Claims, 5 Drawing Figures

I.I.L. WITH GRADED BASE INVERSELY OPERATED TRANSISTOR

BACKGROUND OF THE INVENTION

This invention relates to an integrated injection logic semiconductor device having a lateral transistor and a vertical transistor.

Recently, much attention is paid to an Integrated Injection Logic (I²L) semiconductor device simpler in structure and higher in manufacturing yield and higher in integrated degree than a Transistor Transistor Logic, TTL. This I²L is called also "MTL". The I²L semiconductor device is constructed such that its semiconductor substrate is provided with a switching transistor and an injector for injecting minority carriers into the base region of the switching transistor; and while the minority carriers are being injected into the base region of the switching transistor, the input of the I²L device is so controlled as to effectively control the output of the I²L device, i.e., the collector of a vertical transistor of the I²L device.

In a conventional I²L semiconductor device, an N type semiconductor layer is formed in the semiconductor substrate by vapor epitaxial growth method and first and second P type regions formed by selectively diffusing boron into the N type semiconductor layer at a rate of about $10^{17}$ to $10^{19}$ atoms/cm³ are provided in the N type semiconductor layer. Phosphorus is diffused into the first P type region at a rate of about $10^{19}$ to $10^{21}$ atoms/cm³ to form an N type region in this first region.

In the I²L semiconductor device having the foregoing structure, a lateral PNP transistor is composed of the second P type region (emitter), N type semiconductor layer (base) and first P type region (collector), and a vertical NPN transistor is composed of the N type semiconductor layer (emitter), first P type region (base) and N type region (collector). In the I²L semiconductor device, since, as above described, an N type semiconductor layer region widened downwardly fanwise between the first and second P type regions is used as the base of the lateral transistor, the transport efficiency of carriers supplied from the injector is not sufficient. Further, the base layer of the lateral PNP transistor is commonly used also as the emitter layer of the vertical NPN transistor, and if therefore, the injection and transport efficiencies of one transistor are improved, those of the other transistor will be deteriorated with the result that the synthetic efficiency of the semiconductor device is not improved to a greater extent than specified. Further, since the emitter of the vertical transistor is formed of an N type semiconductor layer, the impurity concentration of the vertical transistor can not but be made lower than that of the base region of the vertical transistor. This is also one of causes of deteriorating the injection and transport efficiencies of the transistor.

SUMMARY OF THE INVENTION

The object of the invention is to provide an integrated injection logic semiconductor device improved in the carrier injection efficiency and carrier transport efficiency.

According to the invention, there is provided an integrated injection logic semiconductor device comprising a semiconductor substrate of one conductivity type, a semiconductor layer of the opposite conductivity type laminated on the one conductivity type semiconductor substrate, a first one conductivity type region formed in a manner penetrating through said opposite conductivity type semiconductor layer to reach the one conductivity type semiconductor substrate, a first opposite conductivity type region formed in the first one conductivity type region, a second one conductivity type region formed in the opposite conductivity type semiconductor layer, and a second opposite conductivity type region formed between the second one conductivity type region and one conductivity type semiconductor layer in a manner connected directly to the one conductivity type semiconductor layer. In the integrated injection logic semiconductor device, an integrated injection logic circuit is composed of a lateral PNP transistor whose emitter, base and collector are constituted by said first opposite conductivity type region, said first one conductivity type region, and the opposite conductivity type semiconductor layer, respectively, and a vertical NPN transistor whose emitter, base and collector are constituted by the one conductivity type semiconductor layer plus second opposite conductivity type region, and said second one conductivity type region, respectively.

BRIEF DESCRIPTION OF THE DRAWING

FIGS. 3 and 4 are sectional and plan views of the I²L semiconductor device according to another embodiment of the invention in which a number of I²L circuit elements are formed on the same substrate.

DETAILED DESCRIPTION OF THE INVENTION

Figure 1:
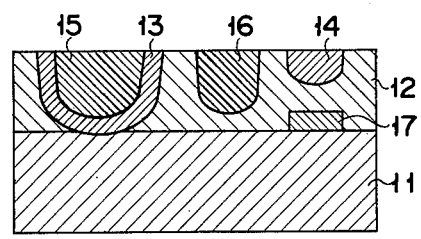
FIG. 1 is a sectional view of an I²L semiconductor device according to an embodiment of the invention.

In FIG. 1, on a semiconductor substrate of one conductivity type, for example, N type a semiconductor layer 12 of the opposite conductivity type, i.e., P type is formed by vapor epitaxial growth method. The semiconductor layer 12 is epitaxially grown on the N type semiconductor substrate by using boron as a P⁻ or π conductivity type impurity, so as to permit the layer 12 to have a boron concentration of $10^{14}$ to $10^{16}$ atoms/cm³ and a thickness of 2 to 3 µm. First and second N type regions 13, 14 are formed in the P⁻ type semiconductor layer 12 by diffusion method. The first and second N type regions 13, 14 are formed in the P⁻ type semiconductor layer by diffusing an N type impurity, for example, phosphorus into this layer at rates of $10^{16}$ to $10^{18}$ atoms/cm³ and $10^{18}$ to $10^{21}$ atoms/cm³, respectively. The first N type region 13 is formed in a manner penetrating the P⁻ type semiconductor layer 12 to reach the N type semiconductor substrate 11, while the second N type region 14 is formed so as not to penetrate through the P⁻ type semiconductor layer 12.

A first P+ type region 15 and a P+ type contact region 16 are formed in the first N type region 13 and the P⁻ type layer 12, respectively. Both P+ type regions 15, 16 are formed by thermally diffusing boron in a high temperature-oxidizing atmosphere of 1050° C to a depth of 1 to 2 µm. A second P type region 17 is formed in a portion of the P type semiconductor layer 12 between the second N type region 14 and the N type semiconductor substrate 11 and contacts the substamce. The first P type region 17 is so formed as to have a sharp inclination of impurity concentration, for example, within a range of $10^{15}$ to $10^{17}$ atoms/cm$^3$ wherein impurity concentration is on the side of the semiconductor substrate higher than the semiconductor layer but lower than the substrate and decreases toward the side of the second N type region 14. Note that the second P type region 17 is formed by ion implantation method or by flush method and that in the case of by ion implantation method this region 17 may be formed before or after the second N type region 14 is formed.

An electrode is formed in each of the above-formed first P type region 15, second N type region 14 and P type contact region 16 by aluminum-deposition step.

Figure 2:
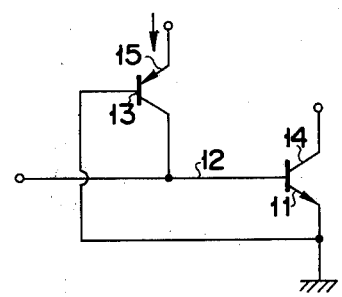
FIG. 2 is a circuit diagram showing an equivalent circuit of the I²L semiconductor device of FIG. 1.

In the above-mentioned semiconductor structure, an I$^2$L circuit element is composed of a lateral PNP transistor whose emitter, base and collector are constituted by the first P type region 15, first N type region 13 and P type semiconductor layer 12, respectively, and a vertical NPN transistor whose emitter, base and collector are constituted by the N type semiconductor substrate 11, P type semiconductor layer 12 plus second P type region 17, and second N type region 14, respectively. An equivalent circuit of this I$^2$L circuit element is shown in FIG. 2.

Figure 3:
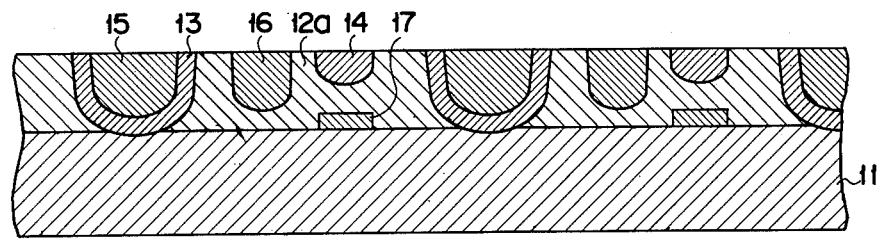
FIG. 3 is an impurity concentration profile of the vertical transistor of the I²L semiconductor device.
Figure 4:
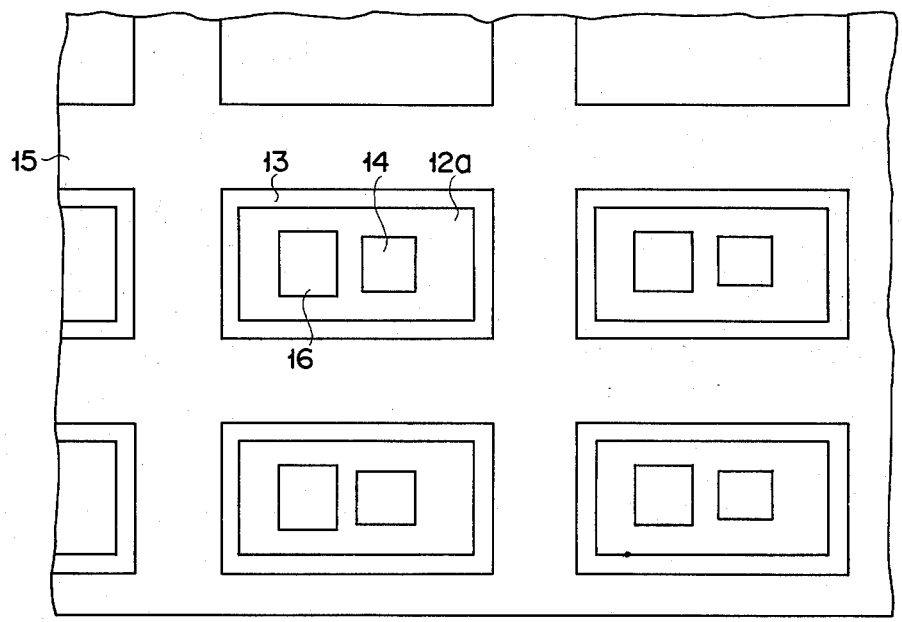

In the above-mentioned I$^2$L circuit element, when, under the condition wherein the emitter of the vertical NPN transistor, i.e., N type semiconductor substrate 11 is set at zero potential (earth potential), a voltage having a logical level of $+0.8$ volt is applied to the emitter of the lateral PNP transistor (acting as an injector), i.e., first P type region 15, positive holes are injected from the injector region 15 to the base region of the lateral PNP transistor, i.e., first N type region 13. These positive holes are passed through the base region 13 to reach the collector region, i.e., P type semiconductor layer 12. As a result, the positive holes in the collector region 12 become excessive in amount to cause electrons to be injected into the collector region 12. Since the P type semiconductor layer 12 as the collector region is commonly used also as the base region of the vertical NPN transistor, injection of electrons into the region 12 causes the vertical transistor to be rendered operative. As a result, the collector region 14 of the vertical transistor has zero potential. In this case, however, the base region of the vertical NPN transistor of the I$^2$L circuit element is kept at a binary "1", that is to say, is opened or is applied with an appropriate positive potential greater than the threshold potential of the emitter grounded type NPN transistor. But, when the base region 12 is made to have a binary "0" or zero potential, this vertical NPN transistor is brought into a nonconductive condition, so that the collector region 14 of the vertical NPN transistor constituting the output of the I$^2$L circuit element has positive potential. That is to say, such I$^2$L circuit element constitutes an inverter wherein when its input is "1", its output is "0" and when its input is "0", its output is "1".

Where an IC is formed by using the above-mentioned I$^2$L circuit element, a plurality of I$^2$L circuit elements are usually formed on the same substrate. FIGS. 3 and 4 show an I$^2$L semiconductor device formed by integrating a plurality of I$^2$L circuit elements. In this I$^2$L semiconductor device, the first N type region 13 is formed in the form of a grid in the P type semiconductor layer 12 laminated on the N type semiconductor substrate 11 and the P type region 15 is formed in the form of a grid within said grid-like first N type region 13. The second N type region 14 and the P type contact region 16 are formed in each of plural P type layer portions 12a prepared by dividing the P type semiconductor layer by the grid shape first N type region 13. The second P type region 17 is provided between the second N type region 14 and the N type semiconductor substrate 11 in a manner allowed to contact the substrate 11.

Since, in the I$^2$L semiconductor device having the above-mentioned structure, the base region of the lateral PNP transistor is so formed as to have a uniform width, the transport efficiency of the carriers (holes) injected into the base region is remarkably improved. Further, since, in the vertical NPN transistor, the impurity concentration of this base region is made much lower than that of the emitter region, the injection efficiency of the carriers injected from this emitter region into the base region and the transport efficiency of the carriers in the base region are remarkably increased.

Figure 5:
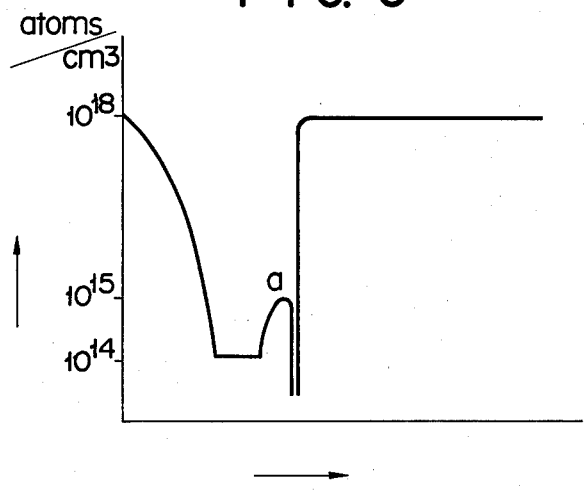
FIG. 5 is an impurity concentration profile of the vertical transistor of the I²L semiconductor device.

Further, since, in the above-mentioned I$^2$L semiconductor device, the second P type region 17 is provided, the impurity concentration profile of the vertical transistor is as shown in FIG. 5. That is, the peak ($a$) of the impurity concentration of the second P type region 17 is higher than that of the P type semiconductor layer but lower than that of the N+ type semiconductor substrate, but sharply declines near substrate 11 asymptotically with respect to the concentration of the substrate. The impurity concentration profile decreases from the peak ($a$) toward the collector region 14 so that the region 17 indicates a sharp impurity concentration declination to a concentration approximating that of the layer 12. For this reason, the minority carriers are effectively injected from the emitter region 11 into the region 17, and further since an accelerating field is applied carrier transport efficiency is improved.

Further, the impurity concentration of the P type semiconductor layer is made lower than that of the semiconductor substrate, and therefore the capacitance at the junction between the semiconductor substrate and P type semiconductor layer becomes small to cause an increase in the operating speed of the vertical transistor as the switching transistor. Accordingly, the power delay product of the I$^2$L semiconductor device is decreased.

The above-mentioned embodiments referred to the case where the semiconductor substrate was an N type semiconductor substrate and other layers and regions were of the conductivity types which were determined correspondingly, but this invention can be applied also to the case where the semiconductor substrate is of a P type and other layer and regions are of the conductivity types which are prepared by inverting the P conductivity type correspondingly.

What we claim is:

1. An integrated injection logic semiconductor device comprising a semiconductor substrate of one conductivity type, a semiconductor layer of the opposite conductivity type laminated on said one conductivity type semiconductor substrate and having a lower impurity concentration than said semiconductor substrate, a first one conductivity type region formed in a manner penetrating through said opposite conductivity type semiconductor layer to reach said one conductivity type semiconductor substrate, a first opposite conductivity type region formed in said first one conductivity type region, at least one second one conductivity type region formed in said opposite conductivity type layer, and a second opposite conductivity type region formed beneath said second one conductivity type region only and connected to said one conductivity type semiconductor substrate, said second opposite conductivity type region having an impurity concentration sharply declining adjacent said substrate and decreasing toward said second one conductivity type region, the peak value of said impurity concentration being higher than that of the semiconductor layer of opposite conductivity type and lower than that of the substrate, whereby a lateral transistor is constituted by said first opposite conductivity type region, said frist one conductivity type region, and said opposite conductivity type semiconductor layer and a vertical transistor is constituted by said one conductivity type semiconductor substrate, said opposite conductivity type semiconductor layer plus said second opposite conductivity type region for providing an accelerating electric field to improve transport efficiency, and said second one conductivity type region.

2. An integrated injection logic semiconductor device according to claim 1, wherein an ohmic contact region of said opposite conductivity type is formed in said opposite conductivity type semiconductor layer.

3. An integrated injection logic semiconductor device comprising a semiconductor substrate of one conductivity type, a semiconductor layer of the opposite conductivity type laminated on said one conductivity type semiconductor substrate, and having a lower impurity concentration than said semiconductor substrate, a first one conductivity type region formed in the form of a grid in a manner penetrating through said opposite conductivity type semiconductor layer to reach said one conductivity type semiconductor substrate, a first opposite conductivity type region formed in the form of a grid in said grid shape first one conductivity type region, a second one conductivity type region formed in each of plural opposite conductivity type semiconductor sections formed by dividing said opposite conductivity type semiconductor layer by said grid shape first one conductivity type region, and a second opposite conductivity type region formed beneath said second one conductivity type region only in a manner connected directly to said semiconductor substrate, said second opposite conductivity type region having an impurity concentration sharply declining adjacent said substrate and decreasing toward said second one conductivity type region, the peak value of said impurity concentration being higher than that of the semiconductor layer of opposite conductivity type and lower than that of the substrate, whereby a lateral transistor is constituted by said first opposite conductivity type region, said first one conductivity type region, and said opposite conductivity type semiconductor layer and a vertical transistor is constituted by said one conductivity type semiconductor substrate, said opposite conductivity type semiconductor layer plus said second opposite conductivity type region and for providing an accelerating field to improve transport efficiency, and said second one conductivity type region.

4. An integrated injection logic semiconductor device according to claim 3, wherein an ohmic contact region is formed in each of said plural opposite conductivity type semiconductor sections.

5. An integrated injection logic semiconductor device comprising an N type semiconductor substrate, a P type semiconductor layer laminated on said N type semiconductor substrate and having a lower impurity concentration than the semiconductor substrate, a first N type region formed in the form of a grid in a manner penetrating through said P type semiconductor layer to reach said N type semiconductor substrate, a first P type region formed in the form of a grid in said grid shape first N type region, a second N type region formed in each of plural P type semiconductor sections formed by dividing said P type semiconductor layer by said grid shape first N type region, and a second P type region formed beneath said second N type region only and connected directly to said semiconductor substrate, said second P type region having an impurity concentration sharply declining adjacent said substrate and decreasing toward said second N type region, the peak value of said impurity concentration being higher than that of the N type semiconductor layer and lower than that of the substrate, whereby a lateral PNP transistor is constituted by said first P type region, said first N type region, and said P type semiconductor layer and a vertical NPN transistor is constituted by said N type semiconductor substrate, said P type semiconductor layer plus said second P type region for providing an accelerating field to improve transport efficiency, and said second N type region.

6. An integrated injection logic semiconductor device according to claim 5, wherein an ohmic contact region is formed in each of said plural P type semiconductor sections.

7. An integrated injection logic semiconductor device according to claim 5, wherein said first N type region has a higher impurity concentration than said P type semiconductor layer.

* * * * *